(12) United States Patent
Lai et al.

(10) Patent No.: US 9,466,707 B2
(45) Date of Patent: Oct. 11, 2016

(54) PLANAR MOSFETS AND METHODS OF FABRICATION, CHARGE RETENTION

(71) Applicant: Mau Lam Lai, Hong Kong (HK)

(72) Inventors: Mau Lam Lai, Hong Kong (HK); Yeuk Yin Mong, Hong Kong (HK); Duc Quang Chau, Hong Kong (HK)

( * ) Notice: Subject to any disclaimer, the term of this patent is extended or adjusted under 35 U.S.C. 154(b) by 21 days.

(21) Appl. No.: 14/597,233

(22) Filed: Jan. 15, 2015

(65) Prior Publication Data

US 2015/0200290 A1    Jul. 16, 2015

(30) Foreign Application Priority Data

Jan. 16, 2014 (HK) .................................... 14100500

(51) Int. Cl.
| | |
|---|---|
| H01L 29/78 | (2006.01) |
| H01L 29/66 | (2006.01) |
| H01L 29/06 | (2006.01) |
| H01L 29/10 | (2006.01) |
| H01L 29/788 | (2006.01) |

(52) U.S. Cl.
CPC ....... *H01L 29/7802* (2013.01); *H01L 29/0696* (2013.01); *H01L 29/1095* (2013.01); *H01L 29/66712* (2013.01); *H01L 29/66825* (2013.01); *H01L 29/7841* (2013.01); *H01L 29/7881* (2013.01)

(58) Field of Classification Search
None
See application file for complete search history.

(56) References Cited

U.S. PATENT DOCUMENTS

| | | | |
|---|---|---|---|
| 2005/0121720 A1* | 6/2005 | Sin ..................... | H01L 29/7811 257/341 |
| 2011/0073906 A1* | 3/2011 | Bobde ................ | H01L 29/7806 257/147 |

\* cited by examiner

*Primary Examiner* — Fei Fei Yeung Lopez

(57) ABSTRACT

A planar MOSFET includes a plurality of MOSFET cells. Each MOSFET cell includes an epitaxial layer of a first conductivity type, a body region of a second conductivity type inside the epitaxial layer, the second conductivity type having a polarity opposite to the first conductivity type, a source region inside the body region, a source contact portion to provide electrical contact with the source region, and a gate portion. A drift region is defined in the epitaxial layer between body regions of adjacent MOSFET cells and the gate portions of the adjacent MOSFET cells across said drift region are separated from each other with electrical insulation. A charge induction terminal is provided on the drift region to induce and store electric charge at said drift region upon application of a charge induction voltage at said charge induction terminal.

23 Claims, 13 Drawing Sheets

PLANAR MOSFETS AND METHODS OF FABRICATION, CHARGE RETENTION

CROSS-REFERENCE TO RELATED APPLICATION

This application claims priority of Hong Kong patent application No. 14100500.7 filed on 16 Jan., 2014, the entire content of which is hereby incorporated by reference.

TECHNICAL FIELD

The present disclosure relates to MOSFETs and more particular to planar power MOSFETs such as VDMOS (Vertical Double-Diffused MOS) transistors.

BACKGROUND

Power MOSFETs (Metal-Oxide-Semiconductor Field Effect Transistors) are widely used to facilitate power management and DC/DC conversion in electronic apparatus such as desktop and/or notebook computers, portable devices such as smart phones and power tools, and automotive electronics. When employed in power management applications, the power MOSFETs are usually use as switching devices through which current will through. As such, it is desirable that the 'On'-resistance of power MOSFETs is as low as possible to minimized power loss as well as heat generation.

Typical power MOSFETS are formed from a plurality of MOSFET cells which are connected in parallel. For example, in conventional planar VDMOS (Vertical Double-Diffused MOS) transistors, a basis cell consists of two vertical transistors sharing a common drift region and controlled by a common gate portion which extends across the common drift region. In general, a large common drift region will mean a smaller JFET resistance. If the drift region is not wide enough, the on-state resistance of the transistors will be high. On the other hand, the overall gate capacitance in conventional VDMOS is dependent on the width of the drift region.

The channel of a MOSFET is typically formed by lateral diffusion of dopants underneath the polysilcon gate at a high temperature and by a long thermal cycle. The high temperature and long duration of a thermal cycle process will generate a deep body junction and a non-uniform lateral doping profile underneath the gate. As a result, severe dopant out-diffusion from substrate may also occur.

Furthermore, a deep body junction and severe dopant out-diffusion from substrate require a thicker epitaxial ('epi') layer to sustain the same blocking voltage, and a non-uniform lateral doping profile will require a longer channel length to sustain the same punch-through breakdown voltage. On the other hand, MOSFETs having a long channel length and thick epitaxial layer thickness will result in a high on-resistance and a high power loss in high current application.

It would be beneficial if MOSFETs having improved designs are provided.

SUMMARY

The technical question to be resolved by the present invention is to provide an improved case to overcome shortcomings in related art.

The technical solution of the present invention overcoming the technical question is as follows:

A planar MOSFET includes a plurality of MOSFET cells; wherein each MOSFET cell comprises an epitaxial layer of a first conductivity type, a body region of a second conductivity type inside the epitaxial layer, the second conductivity type having a polarity opposite to the first conductivity type, a source region of the first conductivity type at the top surface of the body region and surrounded laterally by the body region, a channel region inside the body region and extending laterally from the source region, and a gate portion extending laterally on an insulated layer above the channel portion; and wherein a charge induction terminal is formed on and in contact with an insulated layer above a drift region which is defined between adjacent body regions and the charge induction terminal is to induce and store electric charge at said drift region upon application of a charge induction voltage at said charge induction terminal.

Preferably, the charge induction terminal extends laterally between gate portions on adjacent channels across two lateral sides of the drift region.

Preferably, the gate portions of adjacent MOSFET cells across a said drift region are separated from each other with electrical insulation.

Preferably, the charge induction terminal is arranged to induce electric charges in said drift region when the charge induction voltage is applied to the charge induction terminal, and electronic charge of a polarity opposite to the voltage applied are induced in said drift region; and wherein the induced electric charge is store at said drift region after removal of said charge induction voltage.

Preferably, the charge induction terminal is arranged such that drift region resistivity is reduced during MOSFET operation when a positive charge induction voltage is applied at the charge induction terminal to induce negative charge in the drift region.

Preferably, the charge induction terminal comprises a charge retention device to continue inducing electric charge in said drift region after removal of said charge induction voltage, and the charge retention device is electrically insulated from said drift region and from a charge induction contact portion of said charge induction terminal whereat said charge induction voltage is directly applied.

Preferably, said charge retention device comprises an insulated and voltage floating conductive layer which is intermediate said charge induction contact portion and said drift region.

Preferably, said charge retention device is a voltage floating polysilicon layer embedded inside an insulating oxide layer.

Preferably, said charge retention device is a polysilicon layer embedded inside an insulating oxide layer.

Preferably, said charge retention device is a conductive block or layer embedded inside an oxide insulating layer.

Preferably, the polysilicon layer of said charge retention device has a thickness of between 200A and 2000A.

Preferably, said charge retention device is in contact with an oxide layer on said drift region.

Preferably, said charge retention device is aligned in an axial direction with the charge induction contact portion, the axial direction being orthogonal to the surface of said drift region.

Preferably, said charge induction contact portion of said charge induction terminal comprises a polysilicon layer embedded inside an oxide insulating layer, the polysilicon layer of said charge induction contact portion being parallel to the surface of said drift region.

Preferably, the polysilicon layer of said charge induction terminal has a thickness of between 3,000A and 10,000A.

Preferably, the gate portions of adjacent MOSFET cells and said charge induction terminal are arranged such that each gate portion of said adjacent MOSFET cells is above its corresponding channel region and the charge induction terminal is positioned above the drift region.

Preferably, the charge induction terminal is electrically connected to said source contact portion.

Preferably, said charge induction terminal is sandwiched by two gate portions of adjacent MOSFET cells which are on two sides of said drift region and fills the space between the gate portions of adjacent MOSFET cells.

Preferably, the gate portions of adjacent MOSFET cells and said charge induction terminal are formed on a common insulating oxide stack.

Preferably, the body region defines a shallow junction depth of 0.5-5.0 μm.

Preferably, the body region defines a short channel length in the range of 0.5 μm to 5.0 μm and the MOSFET is power MOSFET having a punch-through breakdown voltage of between 20V to 1000V.

A method of forming a planar MOSFET, the planar MOSFET includes a plurality of MOSFET cells, wherein each MOSFET cell comprises an epitaxial layer of a first conductivity type, a body region of a second conductivity type inside the epitaxial layer, the second conductivity type having a polarity opposite to the first conductivity type, a source region inside the body region, a source contact portion to provide electrical contact with the source region, and a gate portion; wherein a drift region is defined in the epitaxial layer between body regions of adjacent MOSFET cells and the gate portions of the adjacent MOSFET cells across said drift region are separated from each other with electrical insulation; and wherein the method comprises: forming a charge induction terminal on the drift region to induce and storing electric charge at said drift region upon application of a charge induction voltage at said charge induction terminal.

BRIEF DESCRIPTION OF THE DRAWINGS

The present invention will be described in detail with reference to the drawings and embodiments. In the drawings.

DETAILED DESCRIPTION OF EMBODIMENTS

For better understanding of the technical features, the purpose and effect of the present invention, embodiments of the present invention will be described in detail with reference to the drawings.

Figure 13A:
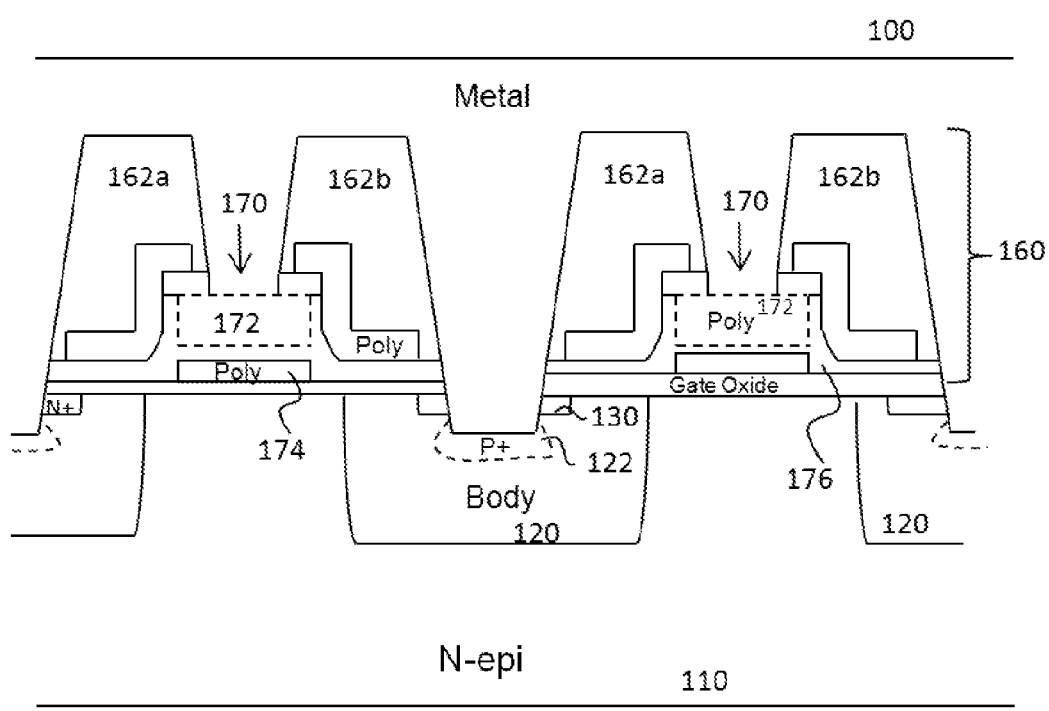
FIG. 13A is a schematic diagram depicting a cross-sectional view of an example MOSFET according to the present disclosure after formation of conductive paths between source contact terminals and body contacts on the composite of FIG. 12.
Figure 13B:
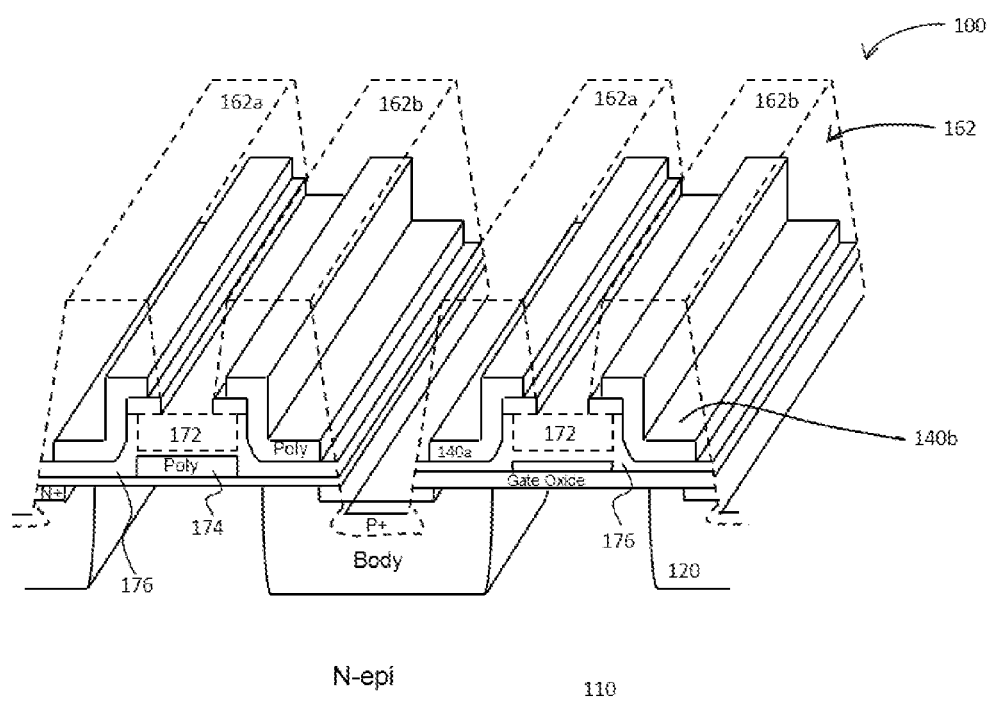
FIG. 13B is a schematic perspective view depicting the example MOSFET of FIG. 13A.
Figure 15A:
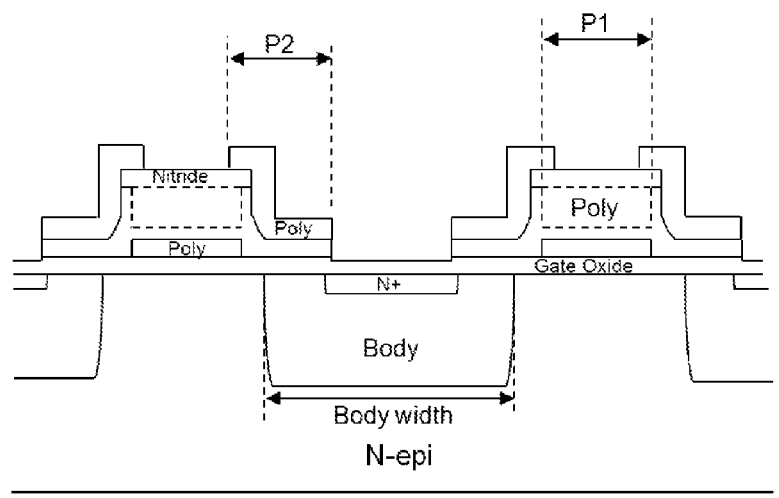
FIGS. 15A and 15B are schematic diagrams depicting example reference dimensional symbols associated with the example MOSFET of FIG. 13A.
Figure 15B:
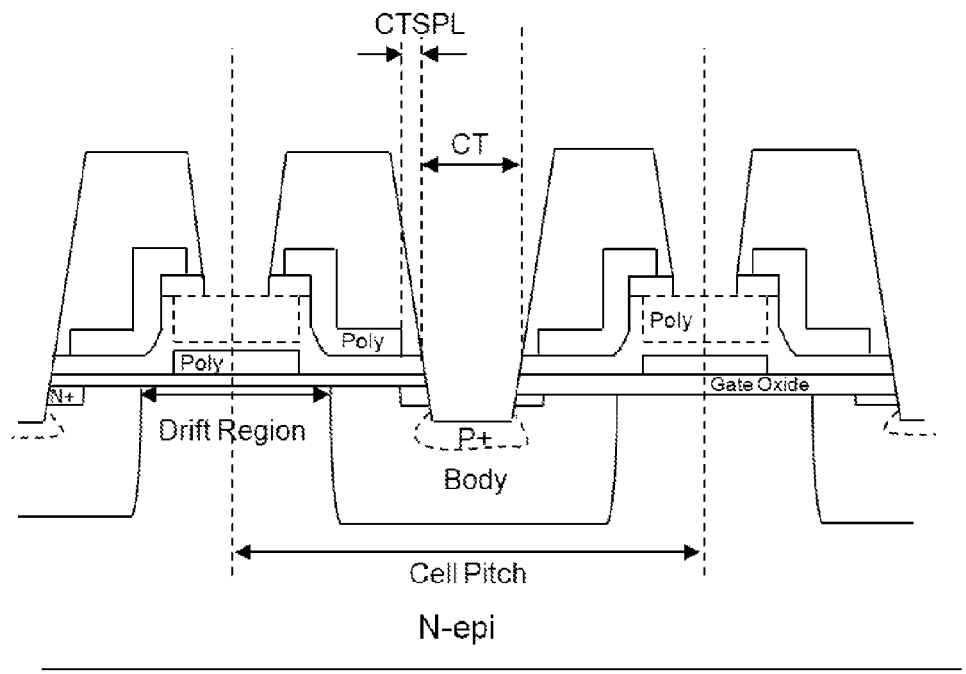

An example N-channel MOSFET 100 depicted in FIGS. 13A and 13B includes a plurality of MOSFET cells. The MOSFET 200 has an N-type epitaxial layer 110 which is formed on an N-type substrate. A plurality of body regions 120 are formed inside the epitaxial layer. The body region 120 has a P-type conductivity which is opposite to the N-type conductivity of the epitaxial layer. An N+ source region 130 is formed inside the body region 120 to define a source junction. A P+ body contact 122 is formed at a top surface of the body region 120 that is not covered by the gate oxide 150 to facilitate making of electrical contact with the body region 120. This top surface of the body region at which the P+ body contact 122 is formed is at a level depressed below the gate oxide layer 150. The source region 130 is formed in the body region 120 at a level immediately underneath the gate oxide layer 150 and above the P+ body contact 122. Two source regions 130 are on opposite sides of the depressed region and this depressed region is filled with metallization 180. The extent of each MOSFET cell in the MOSFET 100 is defined by a cell pitch shown in FIGS. 15A and 15B.

A plurality of composite stacks 160 are formed on the oxide layer which is above the epitaxial layer 110. Each composite stack 160 includes a first gate portion 140a, a second gate portion 140b that is isolated from the first gate portion 140a, a charge induction terminal 170 which is sandwiched between the first gate portion 140a and the second gate portion 140b, and an insulator stack 162. The charge induction terminal 170 includes a charge induction contact portion 172 for applying a charge induction voltage and a charge retention portion 174. The charge induction contact portion 172 and the charge retention portion 174 are both polysilicon layers which are embedded in an insulting oxide stack 176 and insulated from each other by an oxide layer. The insulator stack 162 is formed of ILD and includes a first insulator stack portion 162a and a second insulator stack portion 162b. The first gate portion 140a is embedded inside the first insulator stack portion 162a. The second gate portion 140b is embedded inside the second insulator stack portion 162b. Each of the first and second insulator stack portions 162a, 162b has a chimney shape and has a base portion extending from an inner edge of the source region to project over a lateral portion of the associated composite stack 160. The first and second insulator stack portions 162a, 162b are spaced apart such that a funnel shaped passageway is formed between them. The funnel shaped passaged way provides a path to facilitate metallization contact to the charge induction terminal 170.

Each gate portion 140a, 140b includes a gate contact surface 142 which is in juxtaposing contact with an oxide layer formed on the body portion and an elevated portion. The elevated portion includes a first portion which extends axially upwards from a lateral end of the gate contact surface proximal the charge induction terminal 170 and a second portion which extends at the top axial end of the first portion in a direction parallel to but away from the gate contact surface 142 and projects partially over the charge induction terminal 170. The gate portion on one side of a charge induction terminal 170 has a Z-shape and the gate portion on the other side has a shape this is of mirror symmetry to the Z-shaped gate portion. The charge induction terminal 170 spans across most of the epitaxial layer between two adjacent body regions.

The composite stack 160 is covered by ILD except at the P+ body contact region where the funnel shaped passageway is defined. The funnel shaped passageway is filled with metallization and the metallization connects the charge induction terminal 170 with the P+ body contact region.

An example processing sequence to form a planar MOSFET of FIGS. 13A and 13B is depicted with reference to FIGS. 1 to 13A.

Figure 1:
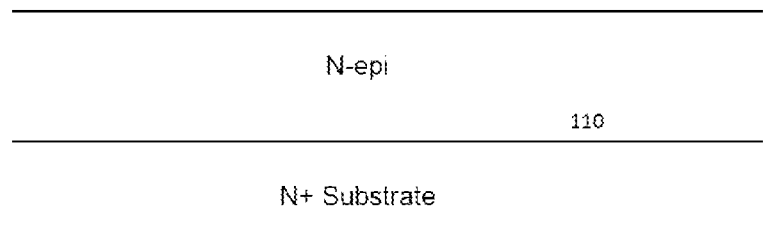
FIG. 1 is a schematic diagram depicting a cross-sectional view showing an N-epitaxial layer on an N+ substrate.
Figure 2:
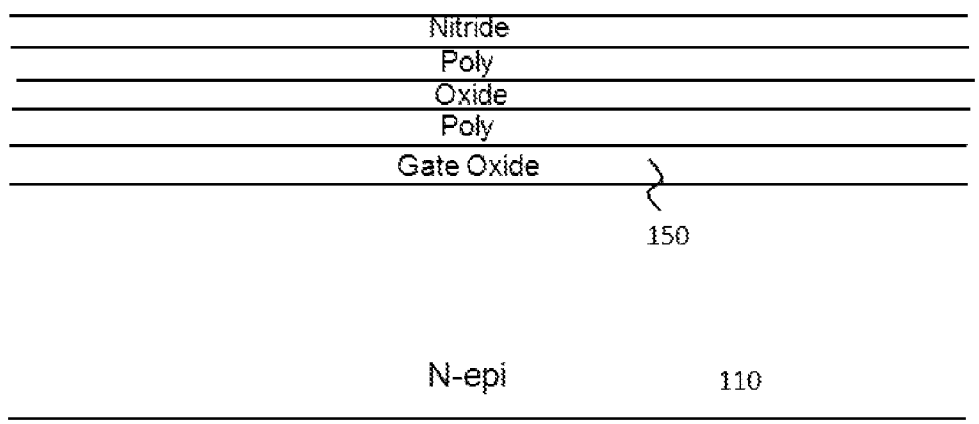
FIG. 2 is a schematic diagram depicting a cross-sectional view showing the N-epitaxial layer in FIG. 1 further with an oxide layer, a first polysilicon layer on the oxide layer, as second oxide layer on the first polysilicon layer, second polysilicon layer on the second oxide layer and a nitride layer on the second polysilicon layer.

An N-channel power MOSFET is to be formed in an N-type epi layer, which is grown on an N+ substrate, as shown in FIG. 1. As depicted in FIG. 2, a layer of thermal oxide (60A to 2000A) is grown. A distinct multi-layer of film stack is deposited on top of the thermal oxide. This distinct multi-layer of film stack composes of a thin layer of polysilicon (200A to 2000A), a thin layer of LP-TEOS (100A to 1000A) and a 2nd layer of thick polysilicon (3000A to 10000A). These two layers of polysilicon are insitu-doped polysilicon or they can be doped by implantation or other method. An optional thin layer of nitride around 200A to 1000A is deposited on top of the second layer of thick polysilicon to serve as poly etch stopper to prevent too much of polysilicon loss on the stack poly during poly spacer etch.

Figure 3:
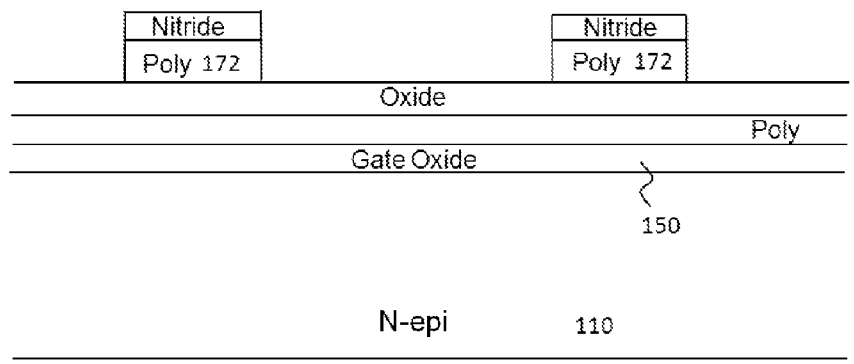
FIG. 3 is a schematic diagram depicting a cross-sectional view showing the formation of isolated polysilicon stacks from the composite of FIG. 2.
Figure 4:
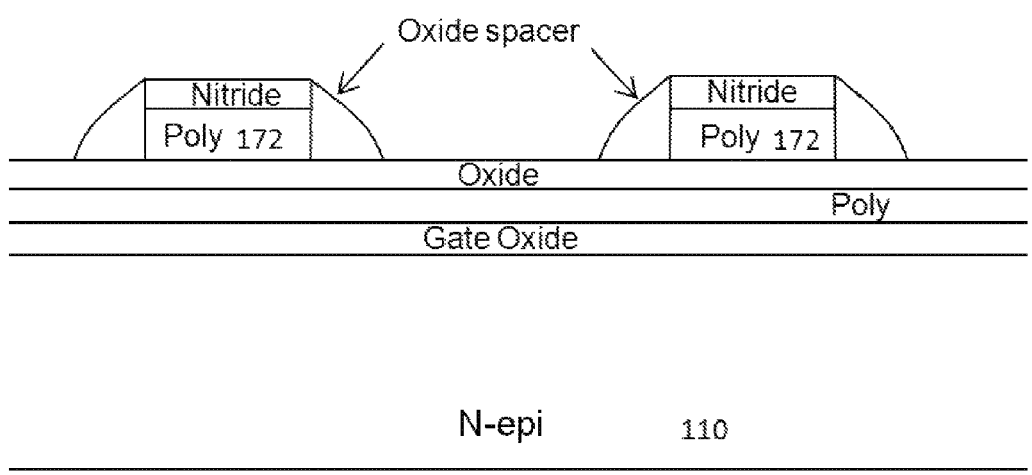
FIG. 4 is a schematic diagram depicting a cross-sectional view showing the formation of oxide spacers around the isolated polysilicon stacks of the composite of FIG. 3.
Figure 5:
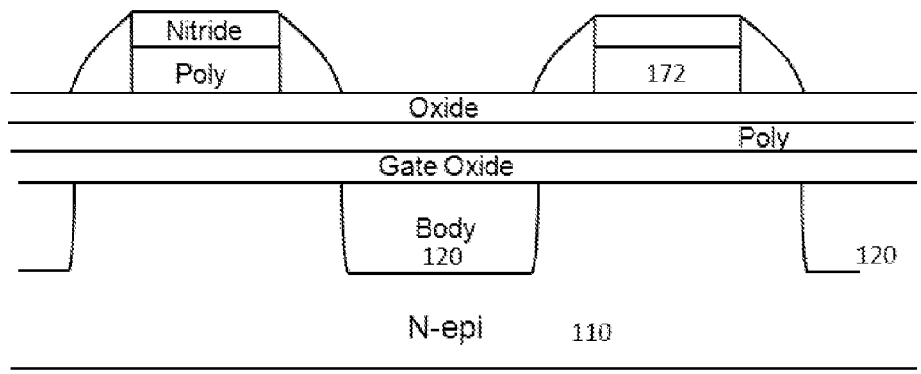
FIG. 5 is a schematic diagram depicting a cross-sectional view showing formation of body regions in the epitaxial layer of the composite of FIG. 4.
Figure 6:
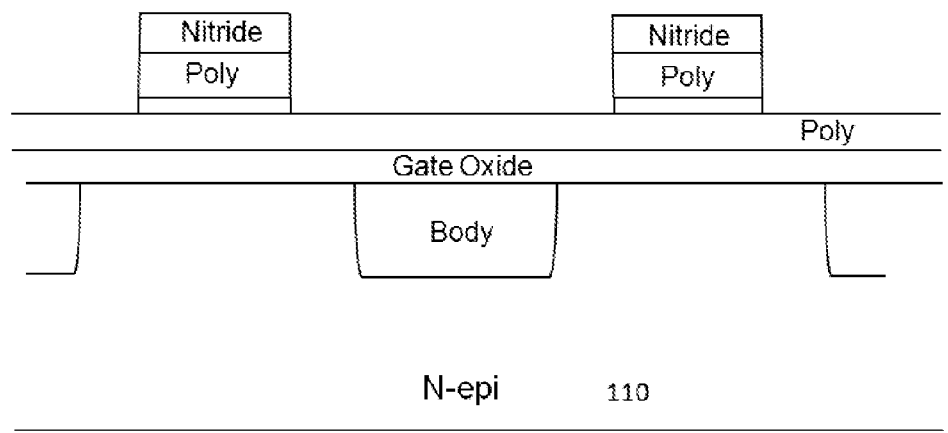
FIG. 6 is a schematic diagram depicting a cross-sectional view showing etching of the oxide spacers after formation of the composite of FIG. 5.
Figure 7:
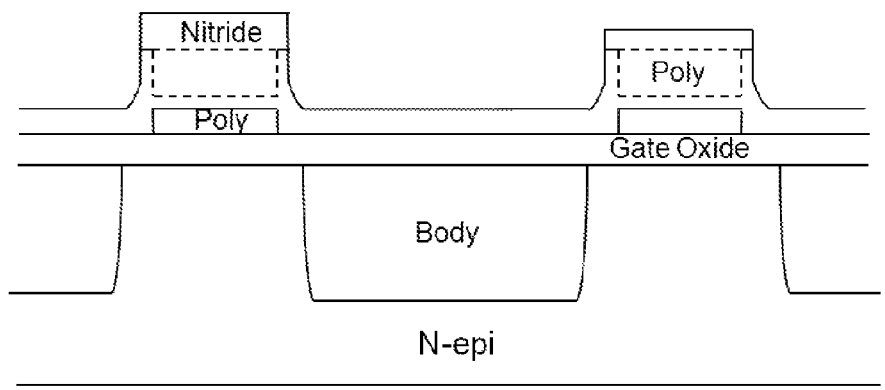
FIG. 7 is a schematic diagram depicting a cross-sectional view showing the formation 25 of a new and continuous layer of oxide on the top surface of the composite of FIG. 6.
Figure 8:
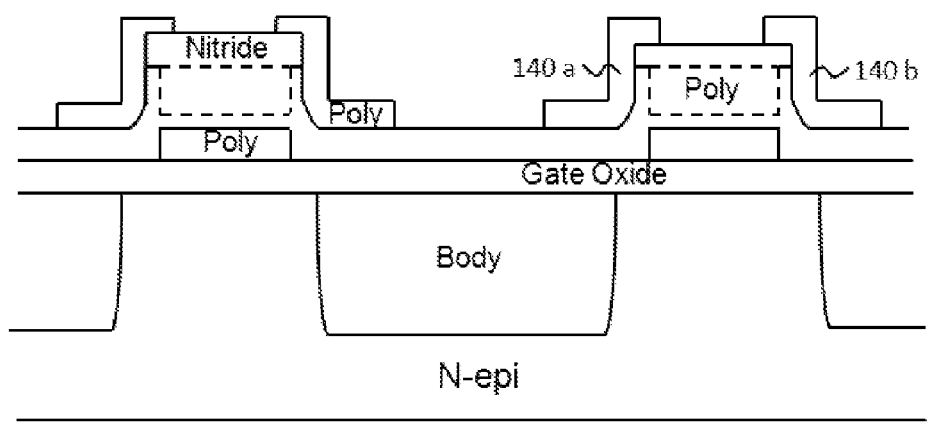
FIG. 8 is a schematic diagram depicting a cross-sectional view showing the formation of polysilicon spacers around protruding portions on the top surface of the composite of FIG. 7.
Figure 9:
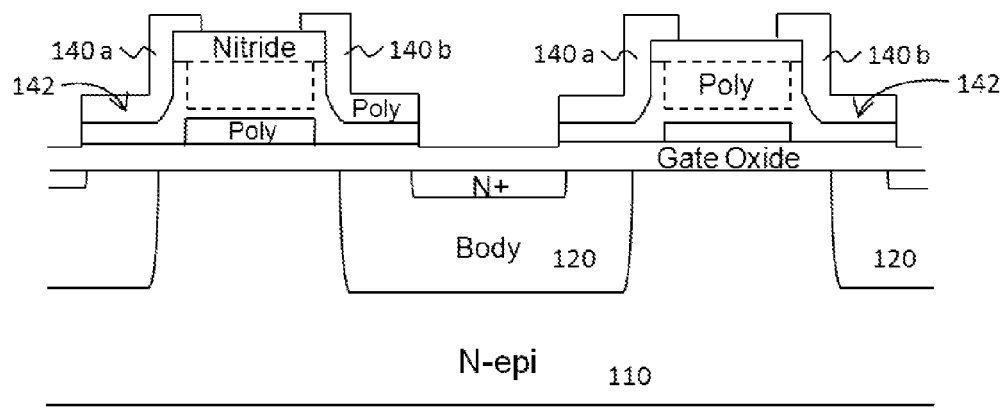
FIG. 9 is a schematic diagram depicting a cross-sectional view showing the formation of source regions inside corresponding body regions on the composite of FIG. 8.

A first mask (poly-stack mask) is used to define poly-stack as shown in FIG. 3. The exposed nitride and polysilicon are etched away. The oxide stopper is acted as an etch stop layer to prevent any further etching into first layer of thin polysilicon. A layer of oxide (2000A to 10000A) is deposited and a blanket etch is used to form oxide spacer at the sidewall of poly-gate as shown in FIG. 4. A blanket multiple implantation (Boron dose of 1E12 to 1E14 with 40 keV to 260 keV) is performed to form a tailor-made P-body junction as shown in FIG. 5. The impurities implant through the thin layer of polysilicon to form shallow body-junctions, but the thick poly region blocks the impurities to reach silicon surface. The P-body junction formation is self-aligned to the gate-poly. Wet oxide etch is used to remove oxide spacer as shown in FIG. 6. A short thermal cycle with oxygen flow is then performed to activate and drive-in the P-type impurities. At the same time, the thin layer of poly on the exposed area and the sidewall of the poly-stack are also oxidized (200A to 1000A) to form an isolated poly. Since the thin layer of poly underneath the isolated poly cannot be oxidized, a thin layer of floating gate is formed as shown in FIG. 7. A third layer of polysilicon (2000A to 7000A) is then deposited. Blanket poly etch or poly etch in a mask is employed to create poly spacer along the sidewall of isolated poly-stack as shown in FIG. 8. A channel with uniformity lateral doping profile is form.

Figure 10:
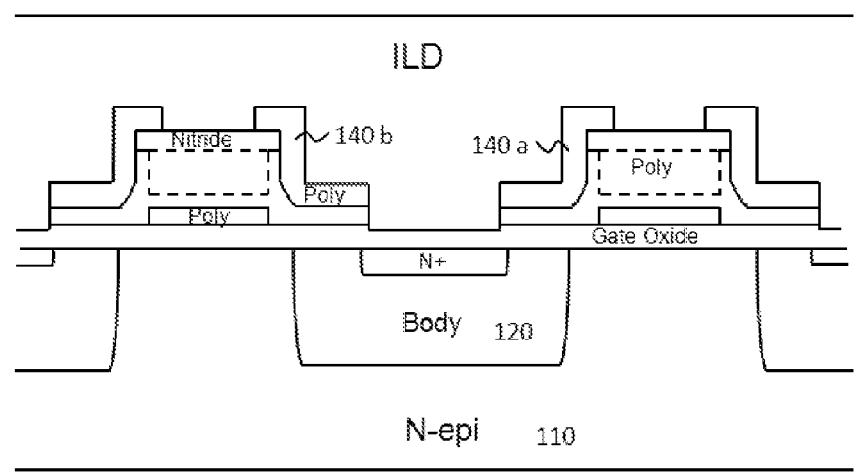
FIG. 10 is a schematic diagram depicting a cross-sectional view showing deposition of interlayer dielectric (ILD) on the composite of FIG. 9.
Figure 11:
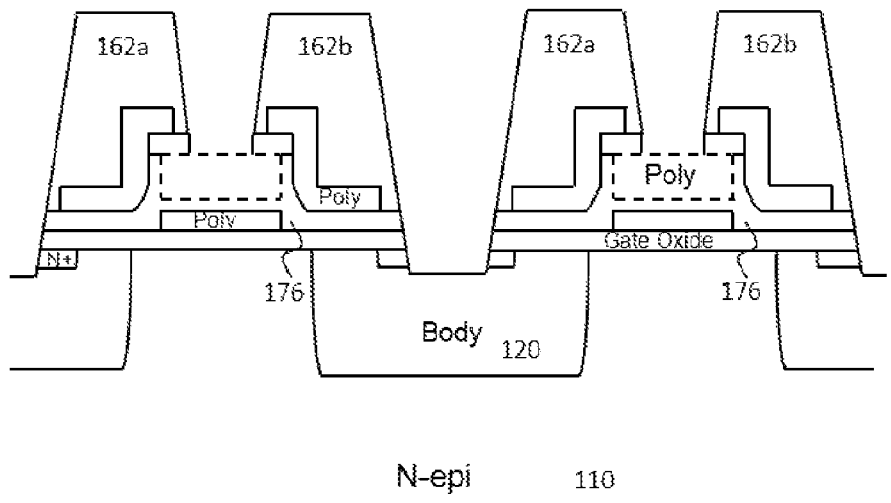
FIG. 11 is a schematic diagram depicting a cross-sectional view showing formation of source contact regions on the composite of FIG. 10.
Figure 12:
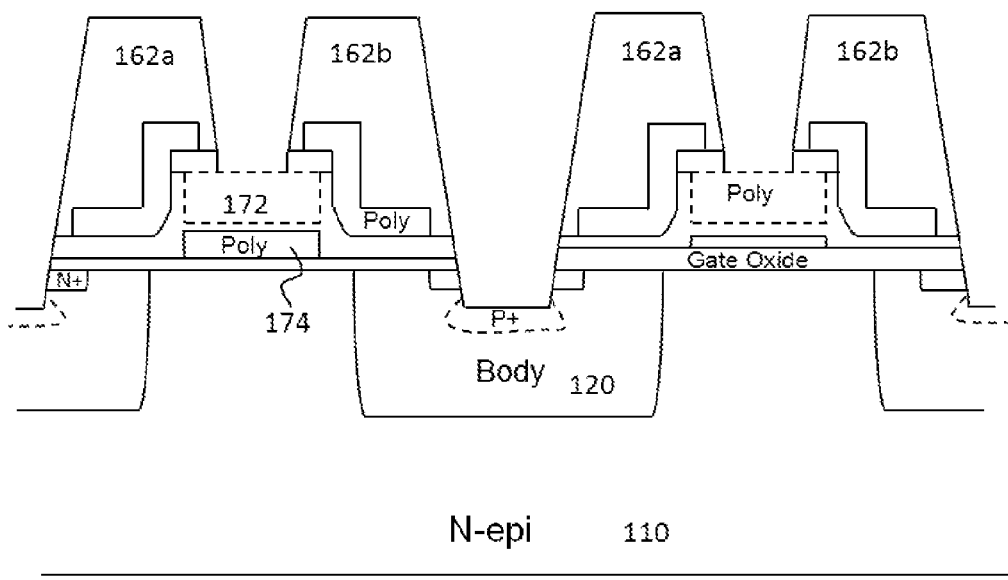
FIG. 12 is a schematic diagram depicting a cross-sectional view depicting formation of body contacts for making electrical contact with the body region on the composite of FIG. 11.
Figure 14:
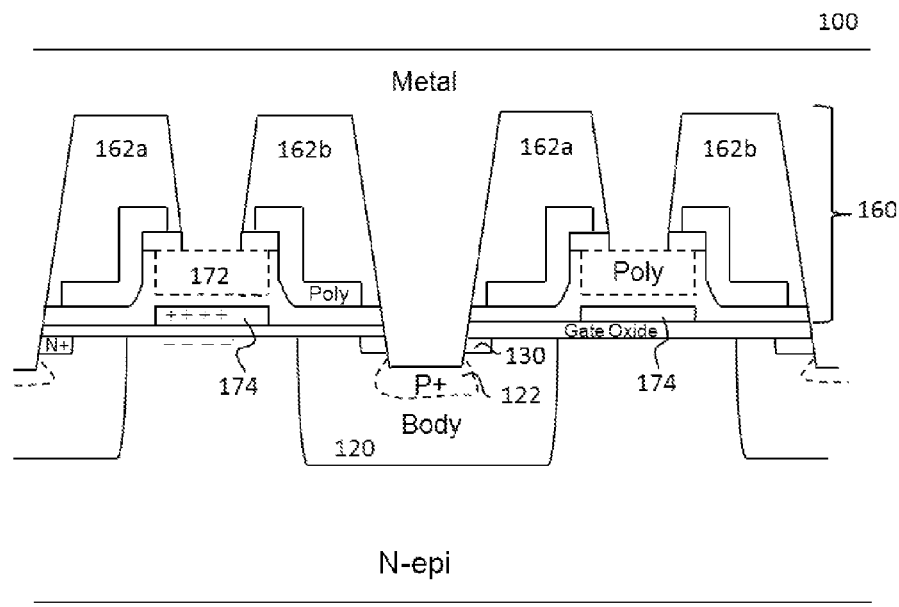
FIG. 14 is a schematic diagram depicting a cross-sectional view depicting the example planar MOSFET in an example operation state.

An optional blanket high energy P-type implant (Boron_1E12 to 1E14) is used to form the deep P-body. A blanket N-type implant (Arsenic_5E15) is used to form N+ source region shown in FIG. 9. USG (Undoped Silicate Glass) and BPSG (Borophosphosilicate Glass) are deposited as the ILD (Inter-Layer Dielectric). A short thermal cycle is used to flow the BPSG to achieve better planarization and anneal the source impurities as shown in FIG. 10. A contact mask is used to define the contact holes. Contact etch includes oxide etch and silicon etch. 1000A to 3000A of silicon at surface is removed during contact etch as shown in FIG. 11. A blanket P+ implant (Boron or BF2_1E15 to 5E15) is performed to form the P+ body contacts as shown in FIG. 12. A layer of barrier metal and aluminum are then deposited to fill the contact holes. A metal mask is used to define the source and gate pads as shown in FIGS. 13A and 14. Metallization by way of metal deposition connects the charge induction terminal 170 and the P+ body contact region.

Figure 16A:
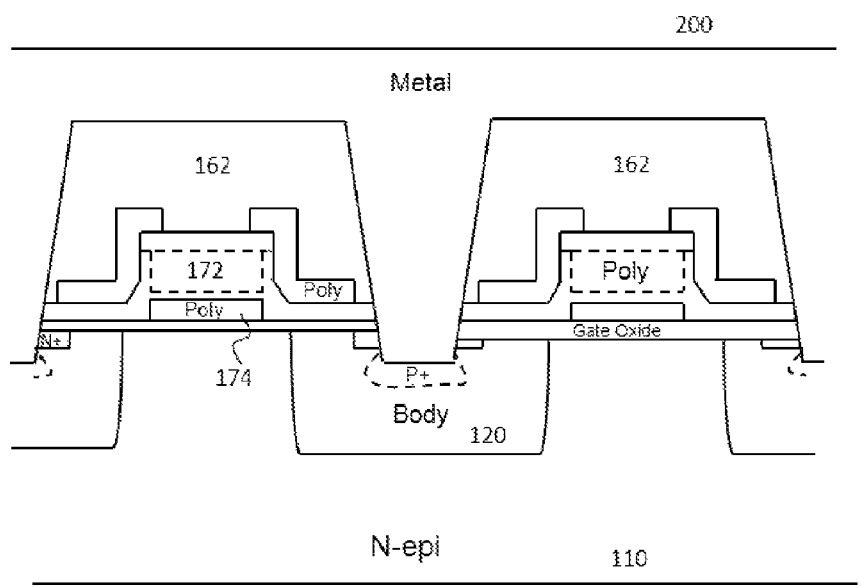
FIG. 16A is a schematic diagram depicting a cross sectional view of another example planar MOSFET according to the disclosure.
Figure 16B:
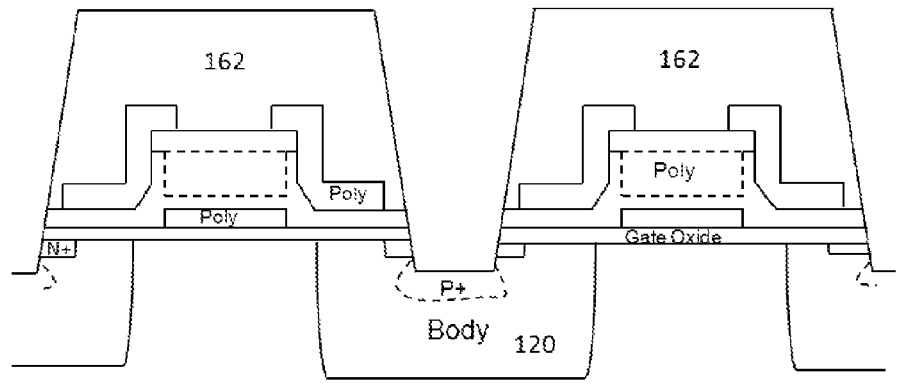
FIGS. 16B and 16C depict a partial sequence of steps for fabrication of the MOSFET of FIG. 16A.
Figure 16C:
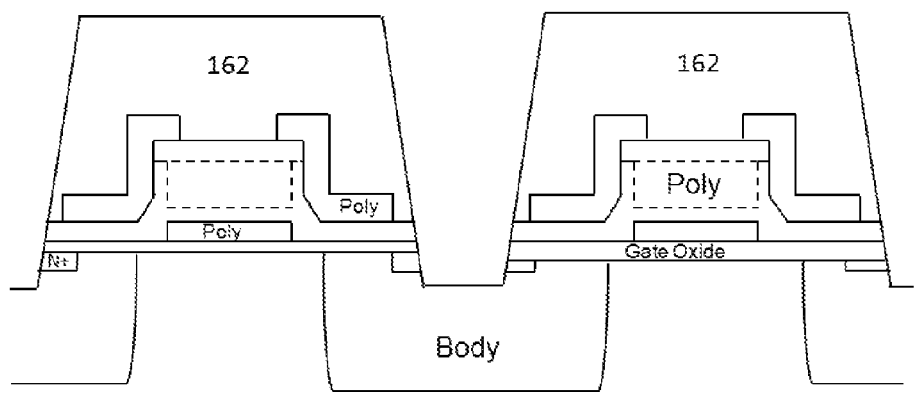

An example planar MOSFET 200 depicted in FIG. 16A is identical to the MOSFET of FIG. 13 except that the entire composite stack 160 is covered by ILD without leaving a channel to lead to the charge induction terminal 170, thereby isolating the charge induction terminal 170 from the P+ body contact. The planar MOSFET of FIG. 16A can be fabricated from the example process of FIGS. 1-10 in combination with the process shown in FIGS. 16B and 16C.

Figure 17A:
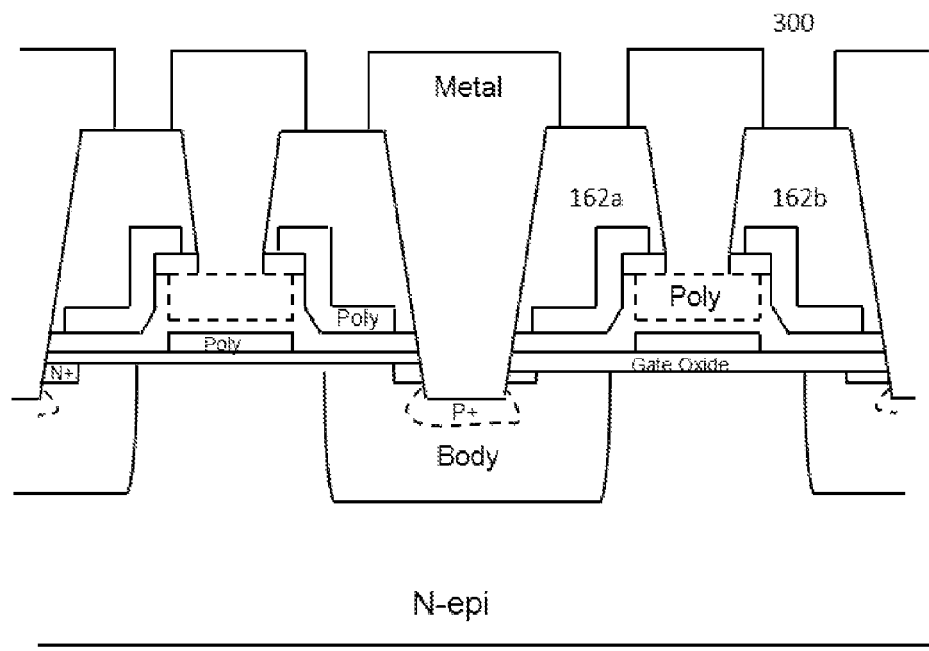
FIG. 17A is a schematic diagram depicting a cross sectional view of yet another example planar MOSFET according to the disclosure.
Figure 17B:
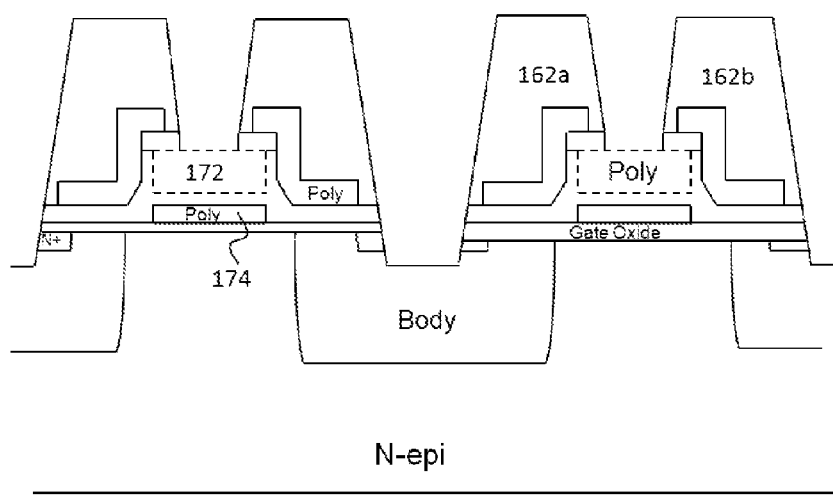
FIGS. 17B and 17C depict a partial sequence of steps for fabrication of the MOSFET of FIG. 17A.
Figure 17C:
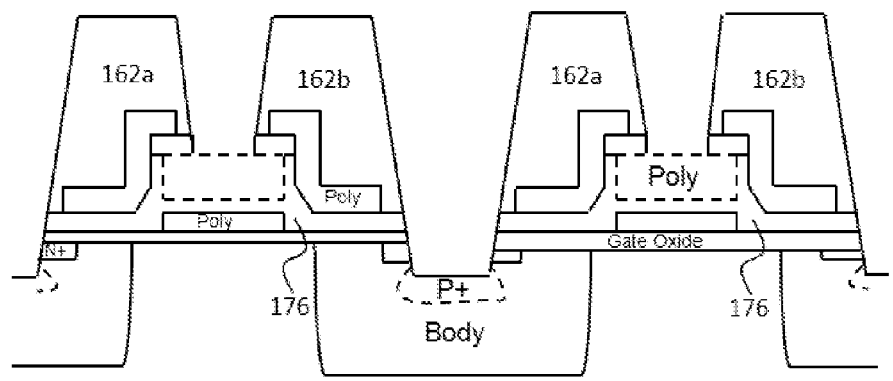

An example planar MOSFET 300 depicted in FIG. 17A is identical to the MOSFET of FIG. 13A except that the metallization connecting to the charge induction terminal 170 and the metallization connecting to the P+ body contact are separate and isolated from each other such that the same voltage or different voltages can be applied to the charge induction terminal 170 and the metallization connecting to the P+ body contact according to practical requirements. The planar MOSFET of FIG. 17A can be fabricated from the example sequence of FIGS. 1 to 10 in combination with the process shown in FIGS. 17B and 17C.

Example dimensions of the planar MOSFET of FIGS. 13A, 16A and 17A are as follows:

Poly 1 width (P1): 0.40 µm to 5.0 µm; Poly 2 width (P2): 0.50 µm to 5.0 µm; Contact width (CT): 0.40 µm to 2.0 µm; Contact space to Poly (CTSPL): 0.10 µm to 4.0 µm; Drift region: 0.40 µm to 5.0 µm; Cell pitch: 2.0 µm to 20 µm.

Figure 18:
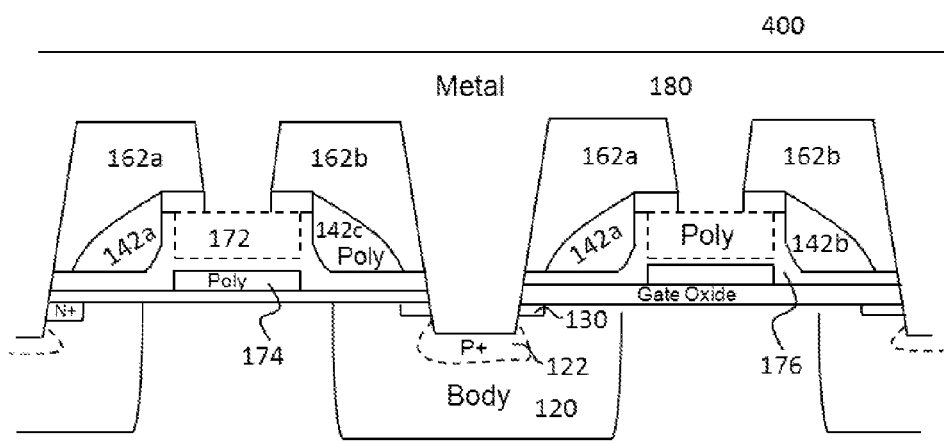
FIG. 18 is a schematic diagram depicting a cross sectional view of a further example planar MOSFET according to the disclosure.

An N-channel MOSFET 400 depicted in FIG. 18 includes a plurality of MOSFET cells. The N-channel MOSFET has an N-type epitaxial layer 110 which is formed on an N-type substrate. A plurality of body regions 120 are formed inside the epitaxial layer. The body region has a P-type conductivity which is opposite to the N-type conductivity of the epitaxial layer. The body regions are distributed, usually equidistantly, in a lateral direction which defines the width of the MOSFET. The substrate and each of the body regions extends in a longitudinal direction which defines the length of the MOSFET. The body region also extends in an axial direction towards the substrate to define the depth of the body region. An N+ source region 130 is formed inside the body region 120 to define a source junction since the body region has a conductivity which is opposite to that of the source region. The source region extends laterally between two adjacent but spaced apart gate portions 142 which are formed on the same body region 120. A P+ body contact 122 is formed at an exposed surface of the body region surrounded by the source region 130 for making contact with the source region. The top surfaces of the body regions 120 and the epitaxial layer 110 are covered by an oxide layer 150 but the oxide layer 150 does not cover the region of the body contact 122.

A plurality of composite stacks 160 are formed on the oxide layer above the epitaxial layer 110. Each composite stack 160 includes a first gate portion, a second gate portion, and a charge induction terminal 170, which are embedded inside an ILD insulating stack enclosure 162. The charge induction terminal 170 includes a charge induction contact portion 172 for applying a charge induction voltage and a charge retention portion 174. The charge induction contact portion 172 and the charge retention portion 174 are embedded in an insulting oxide stack 176. This insulting oxide stack 176 has an inverted 'T' shape, with the laterally extending base portion lying squarely on the top surface of the oxide layer 150.

The charge retention portion 174 includes a first polysilicon layer which is in juxtaposed contact with the underlying oxide layer above the drift region. The charge induction contact portion 172 includes a second polysilicon layer which is spaced apart from the first polysilicon layer and at an axial elevation above the first polysilicon layer. The first and second polysilicon layers are substantially parallel and in axial alignment. An oxide layer is formed between the first and second polysilicon layers to provide insulation. The second polysilicon layer is substantially thicker than the first polysilicon layer due to the need to connect with a charge induction voltage to be applied at a contact pad on a longitudinal end of the second polysilicon layer which defines a longitudinally extending polysilicon strip.

Two gate portions of two adjacent MOSFET cells which are built on the same drift region are formed on a composite stack 160 as shown in FIG. 18. The two gate portions are on lateral sides of the vertical portion of the inverted-T shaped oxide stack 176 such that the two gate portions are separated from each other with electrical insulation provided by the oxide stack 176 while forming part of the composite stack 160. The two gate portions are in mirror symmetry about the vertical portion of the inverted-T shaped oxide stack 176 so that the MOSFETs cells have substantially identical performance parameters. In FIG. 18, the gate portion on one lateral side of the oxide stack 176 is denoted with numeral 142a, the gate portion on the other lateral side of the same oxide stack 176 is denoted with reference number 142b, and the gate portion of an adjacent MOSFET cell which is built on the same body region as that of gate portion 142a is denoted by reference numeral 142c. In general, all gate portions are denoted by the reference number 142 unless suffice is required for further distinction. In general, all gate portions either identical or identical in mirror symmetry. The composite stack 160 including the gate portion 142c and the composite stack 160 including the gate portions 142a and 142b are separated by an elongate passageway. The elongate passageway extending axially away or upwardly from the body contact 122 to provide a lead channel for making contact with the body contact 122. This elongate passageway is filled with metallization 180 as depicted in FIG. 18 and the metallization 180 joins adjacent elongate passageways and the body contact 122.

Each gate portion 142 includes a lateral portion which extends along the length of a MOSFET channel region of a MOSFET cell which extends between lateral boundary edges of the source region 130 and the body region 120. The gate portion extends axially upwards upon leaving the source region to minimize gate influence on the drift region adjacent the body region. Each gate portion 142a, 142b has a rounded profile and a width that increases from a minimum width at the top axial end of the axially extending oxide wall 162 to a maximum width at the bottom axial end of the axially extending oxide wall 162. Similar to the Z-shaped gate portion 140 of the MOSFET of FIG. 13A, the polysilicon gate portion extends laterally from the axially extending oxide wall 162 to the source region 130.

As depicted in FIG. 18, the base of each composite stack 160 extends laterally from a first source region of a first MOSFET cell to a second first source region of a second MOSFET cell in which the first and second MOSFETs share a common drift region.

In operation, a positive charge induction voltage is applied at the charge induction contact portion 172, and this positive charge induction voltage will induce a positive charge at the charge retention portion 174 and negative charge at the drift regions. The induced negative charge will improve conductivity at the drift region due to the increased negative charge. When the charge induction voltage is removed, the positive charge will be trapped at the first polysilicon layer since this first polysilicon layer is embedded inside the inverted-T shaped oxide stack 176 and is floating. The trapped positive charge at the charge retention portion 174 will continue to induce negative charge at the drift region, thereby continuing to increase conductivity at the drift region. As a result, the on-resistance of the MOSFET will be reduced. In other applications, the charge retention properties of this MOSFET can be used in memory applications.

While polysilicon layers are used as both the charge induction contact portion 172 and charge retention portion 174, it will be appreciated that other conductive materials may be used without loss of generality.

In another example, a power MOSFET according to the present disclosure may be identical to that of FIG. 18 but with the entire gate sub-assembly comprising the gate portions 142a and 142b, the charge induction terminal 170 and the oxide walls covered by a single insulator stack 162 such that the charge induction terminal 170 is isolated from metallization, similar to that of FIG. 16A. In use, the charge induction terminal 170 may be connected to a voltage source or allowed to be left floating.

In another example, a power MOSFET according to the present disclosure may be identical to that of FIG. 18 but with a first metallization for connection with the body contact 122 and a second metallization isolated from the first metallization for connection with the charge induction terminal 170. This allows the body contact 122 and the charge induction terminal 170 to be connected to the same of different voltage source or left floating when in use similar to the example of FIG. 17A.

Therefore, there is disclosed a planar MOSFET including a plurality of MOSFET cells. Each MOSFET cell includes an epitaxial layer of a first conductivity type, a body region of a second conductivity type inside the epitaxial layer, the second conductivity type having a polarity opposite to the first conductivity type, a source region of the first conductivity type at the top surface of the body region and surrounded laterally by the body region, a channel region inside the body region and extending laterally from the source region, and a gate portion extending laterally on an insulated layer above the channel portion. A charge induction terminal is formed on and in contact with an insulated layer above a drift region which is defined between adjacent body regions and the charge induction terminal is to induce and store electric charge at said drift region upon application of a charge induction voltage at said charge induction terminal.

In some embodiments, the gate contact surface of the gate portion extends laterally to project above a small portion of the drift region.

In some example embodiments, a planar MOSFET includes a plurality of MOSFET cells. Each MOSFET cell includes an epitaxial layer of a first conductivity type, a body region of a second conductivity type inside the epitaxial layer, the second conductivity type having a polarity opposite to the first conductivity type, a source region inside the body region, a source contact portion to provide electrical contact with the source region, and a gate portion. A drift region is defined in the epitaxial layer between body regions of adjacent MOSFET cells and the gate portions of the adjacent MOSFET cells across said drift region are separated from each other with electrical insulation. A charge induction terminal is provided on the drift region to induce and store electric charge at said drift region upon application of a charge induction voltage at said charge induction terminal.

In some example embodiments, the charge induction terminal extends laterally between gate portions on adjacent channels across two lateral sides of the drift region.

In some example embodiments, the gate portions of adjacent MOSFET cells across a said drift region are separated from each other with electrical insulation.

The MOSFET may be an N-channel MOSFET formed in an N-type epitaxial layer. In such a case, the first conductivity type is N-type and the second conductivity type of an opposite polarity is P-type.

The MOSFET may be a P-channel MOSFET formed in a P-type epitaxial layer. In such a case, the first conductivity type is P-type and the second conductivity type of an opposite polarity is N-type.

In some embodiments, the charge induction terminal is arranged to induce electric charges in said drift region when the charge induction voltage is applied to the charge induction terminal, and electronic charge of a polarity opposite to the voltage applied are induced in said drift region. The induced electric charge is store at said drift region after removal of said charge induction voltage.

In some embodiments, the charge induction terminal is arranged such that drift region resistivity is reduced during MOSFET operation when a positive charge induction voltage is applied at the charge induction terminal to induce negative charge in the drift region.

In some embodiments, the charge induction terminal includes a charge retention device to continue inducing electric charge in said drift region after removal of said charge induction voltage. The charge retention device is electrically insulated from said drift region and from a charge induction contact portion of said charge induction terminal whereat said charge induction voltage is directly applied.

While the dimensions are that of the planar MOSFET of FIGS. 13A, 16A and 17A applies to that of the example planar MOSFET of FIG. 18 of its variations where appropriate without loss of generality.

The foregoing is considered to be illustrative of the principles of the present invention. Furthermore, since modifications and changes to various aspects and implementations will occur to those skilled in the art without departing from the scope and spirit of the invention, it is to be understood that the foregoing does not limit the invention as expressed in the appended claims to the exact constructions, implementations and versions shown and described. For example, while a thick silicon layer is formed as part of a highly conductive path joining the source contact portion and the insulated portion of the drift region, it should be appreciated that the entire highly conductive path can be formed of metal without loss of generally when such process becomes economical.

What is claimed is:

1. A planar MOSFET comprising a plurality of MOSFET cells; wherein each MOSFET cell comprises an epitaxial layer of a first conductivity type, a body region of a second conductivity type inside the epitaxial layer, the second conductivity type having a polarity opposite to the first conductivity type, a source region of the first conductivity type at the top surface of the body region and surrounded laterally by the body region, a channel region inside the body region and extending laterally from the source region, and a gate portion extending laterally on an insulated layer above the channel portion; and wherein a charge induction terminal is formed on and in contact with an insulated layer above a drift region which is defined between adjacent body regions and the charge induction terminal is to induce and store electric charge at said drift region upon application of a charge induction voltage at said charge induction terminal;

wherein the charge induction terminal comprises a charge induction contact portion whereat said charge induction voltage is directly applied and a charge retention device that is floating between the drift region and the charge induction contact portion; said charge retention device is electrically insulated from said drift region and from the charge induction contact portion.

2. The planar MOSFET according to claim 1, wherein the charge induction terminal extends laterally between gate portions on adjacent channels across two lateral sides of the drift region.

3. The planar MOSFET according to claim 1, wherein the gate portions of adjacent MOSFET cells across a said drift region are separated from each other with electrical insulation.

4. The planar MOSFET according to claim 1, wherein the charge induction terminal is arranged to induce electric charges in said drift region when the charge induction voltage is applied to the charge induction terminal, and electronic charge of a polarity opposite to the voltage applied are induced in said drift region; and wherein the induced electric charge is store at said drift region after removal of said charge induction voltage.

5. The planar MOSFET according to claim 1, wherein the charge induction terminal is arranged such that drift region resistivity is reduced during MOSFET operation when a positive charge induction voltage is applied at the charge induction terminal to induce negative charge in the drift region.

6. The planar MOSFET according to claim 1, wherein the charge retention device continues inducing the electric charge in said drift region after removal of said charge induction voltage.

7. The planar MOSFET according to claim 1, wherein said charge retention device comprises an insulated and voltage floating conductive layer which is intermediate said charge induction contact portion and said drift region.

8. The planar MOSFET according to claim 1, wherein said charge retention device is a voltage floating polysilicon layer embedded inside an insulating oxide layer.

9. The planar MOSFET according to claim 1, wherein said charge retention device is a polysilicon layer embedded inside an insulating oxide layer.

10. The planar MOSFET according to claim 1, wherein said charge retention device is a conductive block or layer embedded inside an oxide insulating layer.

11. The planar MOSFET according to claim 9, wherein the polysilicon layer of said charge retention device has a thickness of between 200A and 2000A.

12. The planar MOSFET according to claim 1, wherein said charge retention device is in contact with an oxide layer on said drift region.

13. The planar MOSFET according to claim 1, wherein said charge retention device is aligned in an axial direction with the charge induction contact portion, the axial direction being orthogonal to the surface of said drift region.

14. The planar MOSFET according to claim 1, wherein said charge induction contact portion of said charge induction terminal comprises a polysilicon layer embedded inside an oxide insulating layer, the polysilicon layer of said charge induction contact portion being parallel to the surface of said drift region.

15. The planar MOSFET according to claim 14, wherein the polysilicon layer of said charge induction terminal has a thickness of between 3,000A and 10,000A.

16. The planar MOSFET according to claim 1, wherein the gate portions of adjacent MOSFET cells and said charge induction terminal are arranged such that each gate portion of said adjacent MOSFET cells is above its corresponding channel region and the charge induction terminal is positioned above the drift region.

17. The planar MOSFET according to claim 1, wherein the charge induction terminal is electrically connected to said source contact portion.

18. The planar MOSFET according to claim 1, wherein said charge induction terminal is sandwiched by two gate portions of adjacent MOSFET cells which are on two sides of said drift region and fills the space between the gate portions of adjacent MOSFET cells.

19. The planar MOSFET according to claim 1, wherein the gate portions of adjacent MOSFET cells and said charge induction terminal are formed on a common insulating oxide stack.

20. The planar MOSFET according to claim 1, wherein the body region defines a shallow junction depth of 0.5-5.0 µm.

21. The planar MOSFET according to claim 1, wherein the body region defines a short channel length in the range of 0.5 µm 5.0 µm and the MOSFET is power MOSFET having a punch-through breakdown voltage of between 20V to 1000V.

22. A method of forming a planar MOSFET, the planar MOSFET comprising a plurality of MOSFET cells, wherein each MOSFET cell comprises an epitaxial layer of a first conductivity type, a body region of a second conductivity type inside the epitaxial layer, the second conductivity type having a polarity opposite to the first conductivity type, a source region inside the body region, a source contact portion to provide electrical contact with the source region, and a gate portion; wherein a drift region is defined in the epitaxial layer between body regions of adjacent MOSFET cells and the gate portions of the adjacent MOSFET cells across said drift region are separated from each other with electrical insulation; and wherein the method comprises: forming a charge induction terminal on the drift region to induce and storing electric charge at said drift region upon application of a charge induction voltage at said charge induction terminal; wherein the charge induction terminal comprises a charge induction contact portion whereat said charge induction voltage is directly applied and a charge retention device that is floating between the drift region and the charge induction contact portion; said charge retention device is electrically insulated from said drift region and from the charge induction contact portion.

23. A planar MOSFET comprising a plurality of MOSFET cells; wherein each MOSFET cell comprises an epitaxial layer of a first conductivity type, a body region of a second conductivity type inside the epitaxial layer, the second conductivity type having a polarity opposite to the first conductivity type, a source region of the first conductivity type at the top surface of the body region and surrounded laterally by the body region, a channel region inside the body region and extending laterally from the source region, and a gate portion extending laterally on an insulated layer above the channel portion; and wherein a charge induction terminal is formed on and in contact with an insulated layer above a drift region which is defined between adjacent body regions and the charge induction terminal is to induce and store electric charge at said drift region upon application of a charge induction voltage at said charge induction terminal; wherein the charge induction terminal is arranged to induce electric charges in said drift region when the charge induction voltage is applied to the charge induction terminal, and electronic charge of a polarity opposite to the voltage applied are induced in said drift region; and wherein the induced electric charge is store at said drift region after removal of said charge induction voltage.

* * * * *